United States Patent
Masenten et al.

(10) Patent No.: US 7,146,146 B2
(45) Date of Patent: Dec. 5, 2006

(54) SYSTEMS AND METHODS FOR COHERENT ADAPTIVE CALIBRATION IN A RECEIVER

(75) Inventors: Wesley K. Masenten, Irvine, CA (US); Peggy L. Escobedo, Downey, CA (US); Chinghsiu Shih, Irvine, CA (US); Erik C. Fountain, San Clemente, CA (US); Robert A. Dell-Imagine, Orange, CA (US)

(73) Assignee: DiTrans IP, Inc., Menlo Park, CA (US)

( * ) Notice: Subject to any disclaimer, the term of this patent is extended or adjusted under 35 U.S.C. 154(b) by 430 days.

(21) Appl. No.: 10/355,846

(22) Filed: Jan. 31, 2003

(65) Prior Publication Data

US 2004/0152436 A1 Aug. 5, 2004

(51) Int. Cl.
*H04B 1/26* (2006.01)
(52) U.S. Cl. .................... 455/296; 455/226.1; 375/349
(58) Field of Classification Search ............... 455/296, 455/323, 302, 326, 226.1–226; 375/349
See application file for complete search history.

(56) References Cited

U.S. PATENT DOCUMENTS

| | | | |
|---|---|---|---|
| 5,422,889 A | 6/1995 | Sevenhans et al. | 370/442 |
| 5,557,642 A | 9/1996 | Williams | 375/316 |
| 5,604,929 A | 2/1997 | Loper et al. | 455/324 |
| 5,705,949 A | 1/1998 | Alelyunas et al. | 329/304 |
| 5,826,180 A * | 10/1998 | Golan | 455/302 |
| 5,847,619 A * | 12/1998 | Kirisawa | 332/103 |
| 5,930,286 A | 7/1999 | Walley | 375/140 |
| 6,009,317 A | 12/1999 | Wynn | 455/296 |
| 6,122,325 A | 9/2000 | Mogre et al. | 375/261 |
| 6,289,048 B1 * | 9/2001 | Richards et al. | 375/235 |
| 6,294,952 B1 | 9/2001 | Kato | |
| 6,330,290 B1 | 12/2001 | Glas | 375/324 |
| 6,340,883 B1 * | 1/2002 | Nara et al. | 324/76.78 |
| 6,708,020 B1 * | 3/2004 | Hiramatsu et al. | 455/65 |

(Continued)

FOREIGN PATENT DOCUMENTS

DE 196 16 368 C1 12/1997

OTHER PUBLICATIONS

Masenten, WK, Adaptive Signal Processing, TP79-14-13, presented at International Specialist Seminar on Case Studies in Advanced Signal Processing, Sep. 1979.

(Continued)

*Primary Examiner*—Nguyen T. Vo
*Assistant Examiner*—Adeel Haroon
(74) *Attorney, Agent, or Firm*—Orrick Herrington & Sutcliffe LLP

(57) ABSTRACT

An improved calibration system for a receiver is configured to calibrate the I and Q paths to correct for gain mismatch and quadrature phase errors. In a preferred embodiment, the calibration system calibrates the I and Q paths by using a calibration signal and a reference signal coherently generated from the same single frequency source. The calibration signal is input into the receiver and propagated along the I and Q paths of the receiver simultaneously with a received signal. The reference signal coherently extracts the calibration signal from the I and Q paths. The resulting calibration signals include a component at zero frequency that can be used to measure the phase and gain error. The calibration system is configured to adaptively calibrate the gain and phase error by iteratively measuring the gain and phase error and reducing it to the desired level or eliminating it altogether.

35 Claims, 12 Drawing Sheets

U.S. PATENT DOCUMENTS

| | | | |
|---|---|---|---|
| 6,760,577 B1* | 7/2004 | Li | 455/323 |
| 6,785,529 B1* | 8/2004 | Ciccarelli et al. | 455/324 |
| 2003/0053563 A1* | 3/2003 | Mohindra | 375/324 |
| 2003/0231723 A1* | 12/2003 | Hansen | 375/343 |

OTHER PUBLICATIONS

Masenten, WK et al., Direct Conversion Delta-Sigma Receiver, filed as U.S. Appl. No. 09/339,063 on Jun. 23, 1999.

Masenten, WK, Coherent Adaptive Calibration System and Method, filed as U.S. Appl. No. 09/325,073 on Jun. 3, 1999.

Masenten, WK et al., Complex-IF Digital Receiver, filed as U.S. Appl. No. 10/251,663 on Sep. 20, 2002.

Glas, J.P.F "Digital I/Q Imbalance Compensation in a Low-IF Receiver" IEEE Globecom 1998. Globecom '98. The Bridge to Global Integration. Sydney, Australia, No. 8-12, 1998, pp. 1461-1466.

Pickett, M.N. "I-Q Balance Method for Direct Conversion Receiver" Motorola Technical Developments, Motorola Inc. Schaumburg, IL, US vol. 42, Dec. 2000, pp. 26-30.

* cited by examiner

SYSTEMS AND METHODS FOR COHERENT ADAPTIVE CALIBRATION IN A RECEIVER

FIELD OF THE INVENTION

The field of the invention relates generally to wireless communications, and more particularly to the coherent adaptive calibration of a wireless receiver.

BACKGROUND INFORMATION

The proliferation of digital communications systems continues to drive the needs for low cost, high performance radio receivers. This has led to the development of direct conversion and complex digital intermediate frequency (IF) receivers. Complex digital IF receivers generally include two stages. The first stage converts a received signal to a complex digital signal at an intermediate frequency without the analog filters typically associated with a double down conversion receiver. The second stage converts the complex digital IF signal to a digital baseband data signal. Both direct conversion and complex IF double conversion receivers implement a form of quadrature modulation, typically processing a received radio frequency (RF) signal along in-phase (I) and quadrature (Q) pathways.

In an ideal situation, the signals in the I and Q paths would have identical levels of gain and a phase offset of precisely 90°. However, in practice these paths are not ideal. The electrical characteristics of each path can vary with respect to the other, typically due to deviations in the fabrication process. The gain, phase and direct current (DC) offset of the I and Q signals propagating through each path are individually affected by the specific electrical characteristics of each path, as well as variations in operating conditions and drift in the frequency of the received RF signal. Any difference in the gain or phase between the in-phase and quadrature signals is undesirable error, which can prevent the information carried in those signals from being properly retrieved.

Typical quadrature communication systems deal with the effects of corruption through the design of a receiver architecture that avoids these effects, such as the traditional double down conversion receiver or through the design of direct conversion and complex IF double conversion receiver architectures that adhere to strict tolerances over a time and temperature range. The goal of these latter designs is to implement I and Q paths that are identical in gain and maintain a phase offset of 90° independent of the frequency of the received signal. An attempt to obtain this matched condition over time and temperature can require the addition of complex analog circuitry and the use of specialized fabrication processes, both of which add significant time and cost to the development and production of communication systems and still may not achieve the desired performance.

Other conventional systems have attempted to alleviate gain error through non-coherent calibration techniques, where a calibration signal is propagated along the I and Q paths of the receiver. The gain error is measured by squaring these I and Q signals. For example, the squaring of the in-phase signal generates a DC component having an amplitude proportional to the amplitude of the in-phase calibration signal according to well known mathematical principles. However, such non-coherent detection also results in the generation of a series of unwanted DC components due to noise and interference present in the signals. The DC components hamper any measurements made during the calibration process and result in inaccurate measurements of the amplitudes of the I and Q signals.

SUMMARY

The systems and methods described herein provide for a calibration system configured to calibrate the I and Q paths of a receiver to correct for gain mismatch and quadrature phase error.

In a preferred embodiment, which is described below as an example only and not to limit the invention, the calibration system coherently calibrates the I and Q paths by first coupling a calibration signal with a received wireless signal, inputting the signals into the receiver and simultaneously translating and digitizing the signals along the I and Q paths. The calibration signal and a coherent reference signal are generated from the same local oscillator frequency source in such a manner as to maintain their relative phase coherence after the calibration signal has been translated to the complex IF frequency. More specifically in this example, the reference signal is generated at a frequency, $f_{CAL}$, that is equivalent to that of the translated and digitized calibration signal, so that the reference signal can phase coherently extract the calibration signal in the I and Q paths. The resulting coherently demodulated calibration signal may include a component at zero frequency that can be used to measure the phase and gain error.

The frequency of the calibration signal is preferably located in proximity to, but outside of, the bandwidth of the received signal of interest and allows the receiver to calibrate and receive a transmitted signal simultaneously. In another embodiment, the calibration signal can be located within the bandwidth of the received signal. The calibration system can further include, if desired, a calibration measurement unit that measures the gain and phase error present in the I and Q path signals and algorithmically generates a set of calibration parameters from these measurements. The system can further include a correction unit that applies the calibration parameters to the I and Q signals to correct both the gain and phase error present in the I and Q signals.

In still another embodiment, the calibration system is configured to adaptively calibrate the receiver by iteratively measuring the gain and phase error. The calibration system can be configured to measure the error present in a predetermined series of digital I and Q signal samples and generate calibration parameters corresponding to those samples. This adaptive calibration can compensate for time-varying conditions within the receiver and the operating environment. This process may be repeated until the error is reduced to the desired level or eliminated altogether. In this manner, the I and Q paths are calibrated to compensate for the gain and phase errors incurred by the translation and digitization processes.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to the require the details of the example embodiments.

BRIEF DESCRIPTION OF THE FIGURES

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

DETAILED DESCRIPTION

Figure 1:
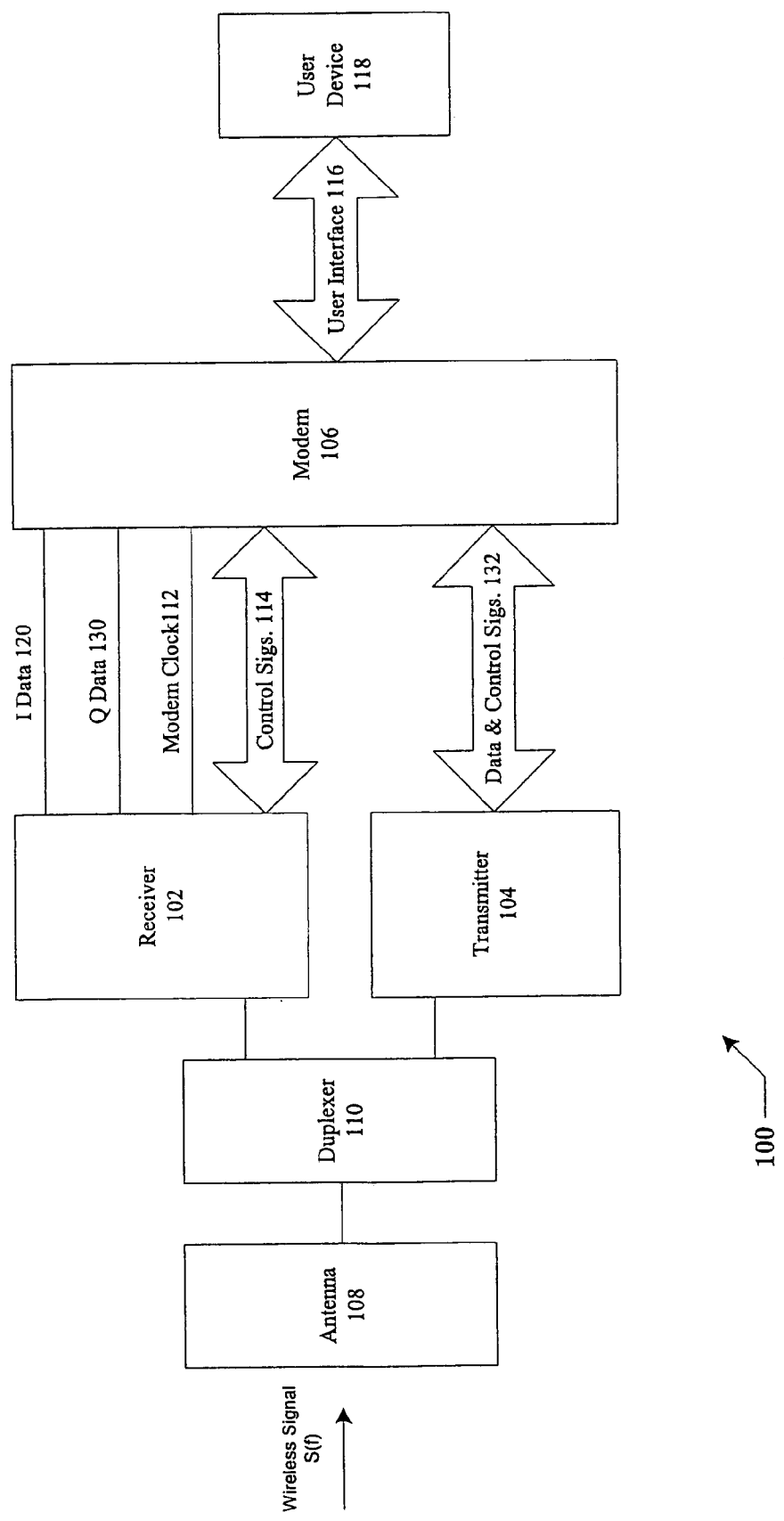
FIG. 1 is a schematic diagram depicting an example wireless system.

The systems and methods described herein provide for the coherent adaptive calibration of the in-phase (I) and quadrature (Q) paths of a complex digital IF receiver in order to compensate for gain mismatch error and quadrature phase error incurred in the translation and digitization processes. To do this, the amount of error in the I and Q paths is coherently measured using a calibration signal introduced at the input of the receiver and then, based on those measurements, the signals present in the I and Q paths are iteratively adjusted to compensate for those errors. This process is repeated until the error is reduced to the desired level or eliminated altogether. In this manner, the I and Q paths are calibrated to compensate for the gain and phase errors incurred by the translation and digitization processes.

More specifically, in the preferred embodiment, the calibration signal and a reference signal are generated from the same local oscillator frequency source located in the receiver. The calibration signal is coupled to the input of the receiver and is then translated and digitized with the received signal along the I and Q pathways. The frequency of the calibration signal is preferably located in proximity to, but outside of, the bandwidth of the received signal of interest. In another embodiment, the calibration signal can be located within the bandwidth of the received signal. As the calibration signal propagates along the I and Q paths it incurs substantially the same gain and phase errors as the received signal.

The reference signal and the calibration signal are coherent because they are both generated from the same local oscillator frequency source. The reference signal is generated at a frequency equivalent to that of the calibration signal after translation. The reference signal is multiplied with the digitized I and Q signals and used to extract the calibration signal from the output of the I and Q paths. The multiplication of the reference and calibration signals creates a DC component that can be readily filtered and used to measure the gain mismatch and quadrature phase errors incurred by the I and Q paths. These gain and phase error measurements are then used to generate calibration parameters, which adjust the I and Q path output signals to compensate for the gain and phase errors.

The entire calibration process is preferably iterative, so that the gain and phase errors are continuously measured and then, based on each new measurement, the outputs of the I and Q paths can be adjusted to compensate for the gain and phase error. Accordingly, this calibration process allows the receiver to adapt to fluctuations in temperature and operating conditions, as well as drifts in frequency of the received signal. The operation and implementation of complex digital IF receivers are discussed at large in the currently pending patent application entitled "Complex-IF Digital Receiver," Ser. No. 10/251,663 filed on Sep. 20, 2002, which is hereby incorporated for all purposes herein.

Before describing the systems and methods for adaptive calibration in detail, it is necessary to briefly describe an example environment in which they can be used. The systems and methods for adaptive calibration can be implemented in any environment where wireless signals are transmitted and received, such as mobile telephony, wireless internet, wireless modem, satellite communication, Bluetooth, wireless local area network (WLAN) and wireless local loop (WLL) systems. One such example environment is shown in FIG. 1, which depicts wireless system 100 in an example wireless modem environment.

In this embodiment, wireless system 100 includes receiver 102, transmitter 104, modem 106, antenna 108, duplexer 110, user interface 116 and user device 118. Wireless system 100 can be a multiple band system, configured to receive and transmit over multiple separate frequency bands. For ease of discussion, wireless system 100 is depicted in a single band configuration. Wireless system 100 operates in a typical fashion, for instance, when wireless system 100 is in a receive state, antenna 108 receives a wireless signal, S(f), and routes it to receiver 102 through duplexer 110. Within receiver 102, the received signal is converted to a digital in-phase (I) data signal 120 and quadrature (Q) data signal 130 and are output to modem 106.

Control signals 112 and modem clock 114 facilitate the transfer of data between receiver 102 and modem 106. Modem 106 processes the data received by receiver 102 and outputs it to user device 118 through user interface 116. User device 118 can be any device, such as a computer, headset, or any other device which supplies data to or receives data from a modem. Conversely, when wireless system 100 is in a transmit state, data is output from modem 106 to transmitter 104, where it is modulated and up-converted to a carrier frequency and output by antenna 108 through duplexer 110.

Figure 2A:
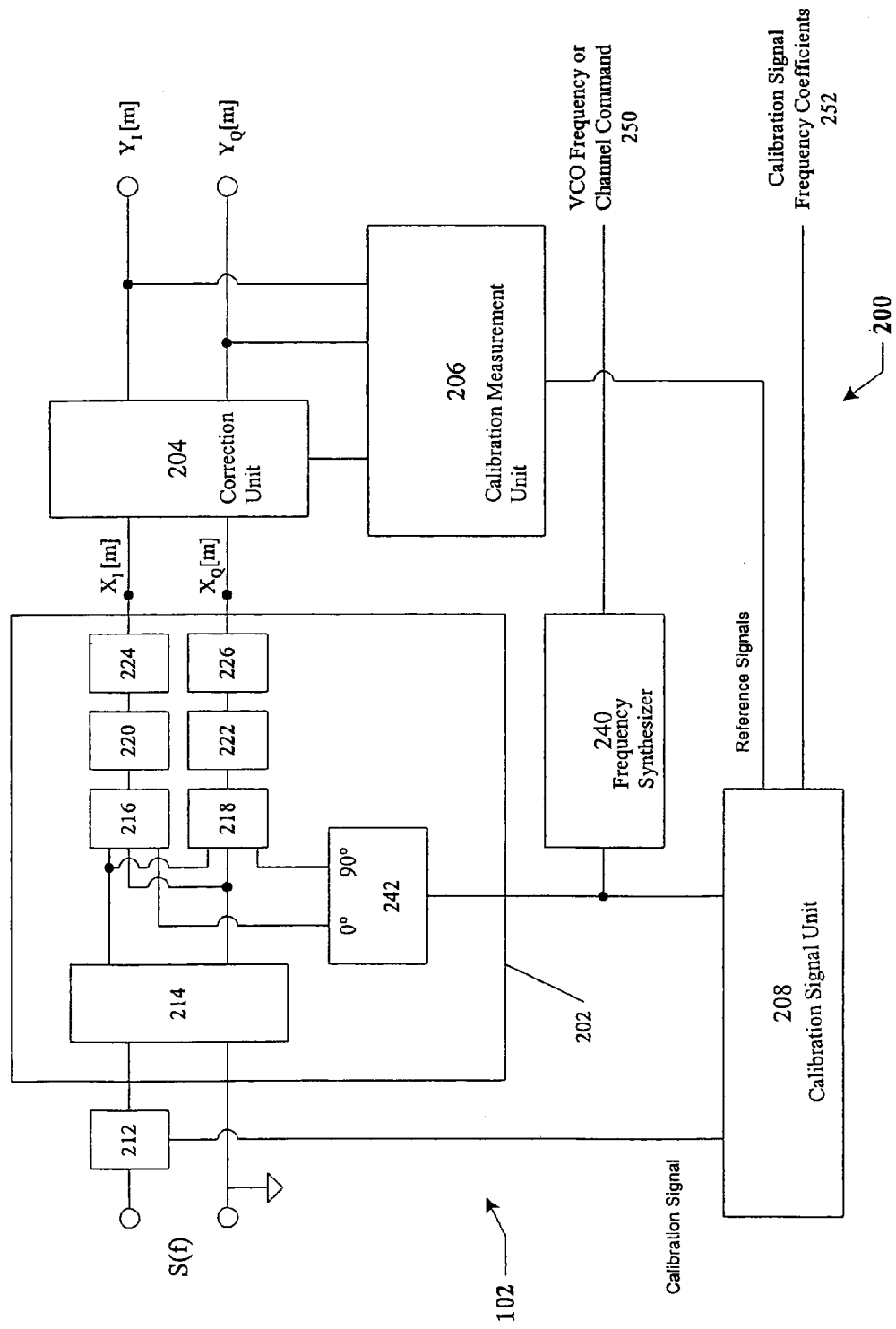
FIG. 2A is a schematic diagram depicting an embodiment of the calibration system within an example receiver.

FIG. 2A depicts calibration system 200 located within an example single-band receiver 102. Receiver 102 is preferably a complex digital IF receiver, but can also be configured as a direct conversion or double-down conversion receiver in other embodiments. In FIG. 2A, complex digital IF receiver 102 includes conversion section 202, coupler 212 and frequency synthesizer 240. Frequency synthesizer 240 preferably generates a local oscillator (LO) signal, at a frequency offset from the received RF signal by the intermediate frequency, using VCO frequency or path command 250. In one embodiment, frequency synthesizer 240 includes the receiver voltage-controlled oscillator (VCO) operating at the local oscillator frequency and phase-locked loop (PLL). It should be noted that, in certain embodiments discussed herein, frequency synthesizer 240 operates at a higher frequency or an integer multiple frequency of the local oscillator signal.

Conversion section 202 performs translation and digitization processes on the received RF signal to output a complex digital IF signal. These processes can introduce much of the gain mismatch and quadrature phase errors that require calibration. Calibration system 200 is coupled with conversion section 202 and includes correction unit 204, calibration measurement unit 206 and calibration signal unit 208. Calibration signal unit 208 uses a local oscillator signal generated by a local oscillator frequency source, exemplified in this embodiment by frequency synthesizer 240, to generate the calibration signal and reference signal. The frequency coefficient 252 of the calibration signal is output to a memory for use in indexing the calibration measurements and parameters generated by calibration measurement unit 206. This index identifies the frequency channel, band, or region which is being corrected. The indexing can be done by the frequency of the calibration signal, the frequency of the received signal, or any other value that facilitates the location and selection of the appropriate calibration parameter. The calibration signal is coupled with the received signal using coupler 212, and both are input to conversion section 202.

Calibration system 200 iteratively corrects the gain and phase error in the digital samples $X_I[m]$ and $X_Q[m]$ with correction unit 204, which is coupled to the output of conversion section 202. Correction unit 204 corrects the errors by applying a set of calibration parameters to the $X_I[m]$ and $X_Q[m]$ signals to generate a set of corrected signals, $Y_I[m]$ and $Y_Q[m]$. The calibration parameters are generated by calibration measurement unit 206, which measures the error in the corrected signals with the reference signal, or more specifically, in phase and quadrature components of the reference signal, Sin_Cal[m] and Cos_Cal[m]. The component reference signals, Sin_Cal[m] and Cos_Cal[m], are derived from the reference signal and in this embodiment, the component reference signals have a quadrature phase offset. Calibration measurement unit 206 then uses these error measurements to algorithmically determine the calibration parameters. Before discussing calibration system 200 in detail, it is helpful to briefly describe the operation of receiver 102.

Figure 3A:
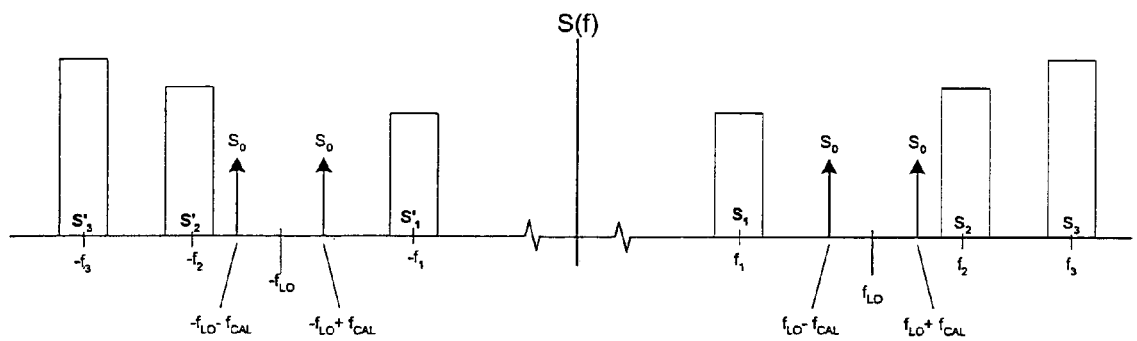
FIG. 3A is a power spectral density graph depicting an example set of signals input to a receiver.

FIG. 3A depicts the two-sided power spectral density of the signals present at the input to conversion section 202, including the received RF carrier modulated signal, S(f) and the calibration signal, $S_0(f)$. S(f) includes signals $S_1(f)$, $S_2(f)$ and $S_3(f)$, each centered around center frequencies $f_1$, $f_2$ and $f_3$, respectively. Each signal also has a corresponding image $S'_1(f)$, $S'_2(f)$ and $S'_3(f)$. In this embodiment, the signal of interest is $S_2(f)$. In this embodiment, the calibration signal is a double sideband signal with a high sideband and a low sideband each centered around local oscillator frequency, $f_{LO}$. Each sideband of the calibration signal is offset from $f_{LO}$ by the frequency $f_{CAL}$, which will be discussed in more detail below. The calibration signal is preferably outside the bandwidth of the signal of interest so that calibration and operation of receiver 102 can occur simultaneously. While the calibration signal is outside the bandwidth it is preferably placed close to, or in proximity to, the bandwidth of the signal of interest in order to achieve the most accurate calibration possible.

The local oscillator frequency, $f_{LO}$, is the translation frequency of conversion section 202 and is derived from the frequency of frequency synthesizer 240, which can operate at $f_{LO}$ or a higher frequency. In embodiments where frequency synthesizer 240 operates at a higher frequency than $f_{LO}$, the higher frequency is preferably an integer multiple of $f_{LO}$. The frequency $f_{LO}$ is also preferably outside the bandwidth of the signal of interest, although it can also be within the bandwidth if the receiver is not processing the receive signal during calibration. The specific frequency chosen for $f_{LO}$ depends on the individual application. For instance, in one embodiment, $f_{LO}$ is algorithmically derived from the frequency of the received signal. For more discussion of the relationship between the local oscillator and received signal frequencies, see the currently pending patent application entitled "Complex-IF Digital Receiver," referenced above.

Referring to FIG. 2A, for applications where the received signals are relatively small, conversion section 202 can include low noise amplifier (LNA) 214 to amplify the input signal to a more robust signal level. In one embodiment, a balun (not shown) placed between coupler 212 and LNA 214 can be included to convert the single-ended input signal to a differential format. After amplification by LNA 214, the differential amplified signal is propagated onto the I and Q paths. The I path includes balanced mixer 216, analog-digital converter (ADC) 220 and decimation filter 224, while the Q path includes balanced mixer 218, analog-digital converter (ADC) 222 and decimation filter 226.

Conversion section 202 also includes quadrature hybrid phase shifter 242. Phase shifter 242 shifts the phase of the output of frequency synthesizer 240 to generate local oscillator (LO) signals at $f_{LO}$ with relative phase offsets of 0 and 90 degrees. These LO signals provide the quadrature phase offset to the I and Q paths. In an embodiment where phase shifter 242 operates digitally, frequency synthesizer 240 can generate an output signal at twice the $f_{LO}$ frequency to facilitate the generation of the LO signals at $f_{LO}$ with the proper quadrature phase offset.

On the I path, the differential amplified signal is mixed with the 0° LO signal in mixer 216. From there, the mixed I path signal is input to analog-digital converter 220. Analog-digital converter 220 converts the I path signal from analog to digital format. In one embodiment, ADC 220 is a delta-sigma converter that converts the mixed analog signal to a digital output signal at a rate equal to or an integer multiple of the LO signal, or translation frequency. The digital signal is then filtered and decimated by decimation filter 224 to form a high resolution, i.e. multi-bit, I path digital sample signal, $X_I[m]$, where m is the sample index.

The Q component signal follows a path similar to that of the I path. The Q signal is output from LNA 214 and mixed with the 90° LO signal in mixer 218. The Q signal then passes through ADC 222 and decimation filter 226, and is output as the Q path digital sample signal, $X_Q[m]$. As mentioned above, receiver 102 can also be implemented in a multiple band configuration, the operation of which would be readily apparent to one of skill in the art.

Figure 2B:
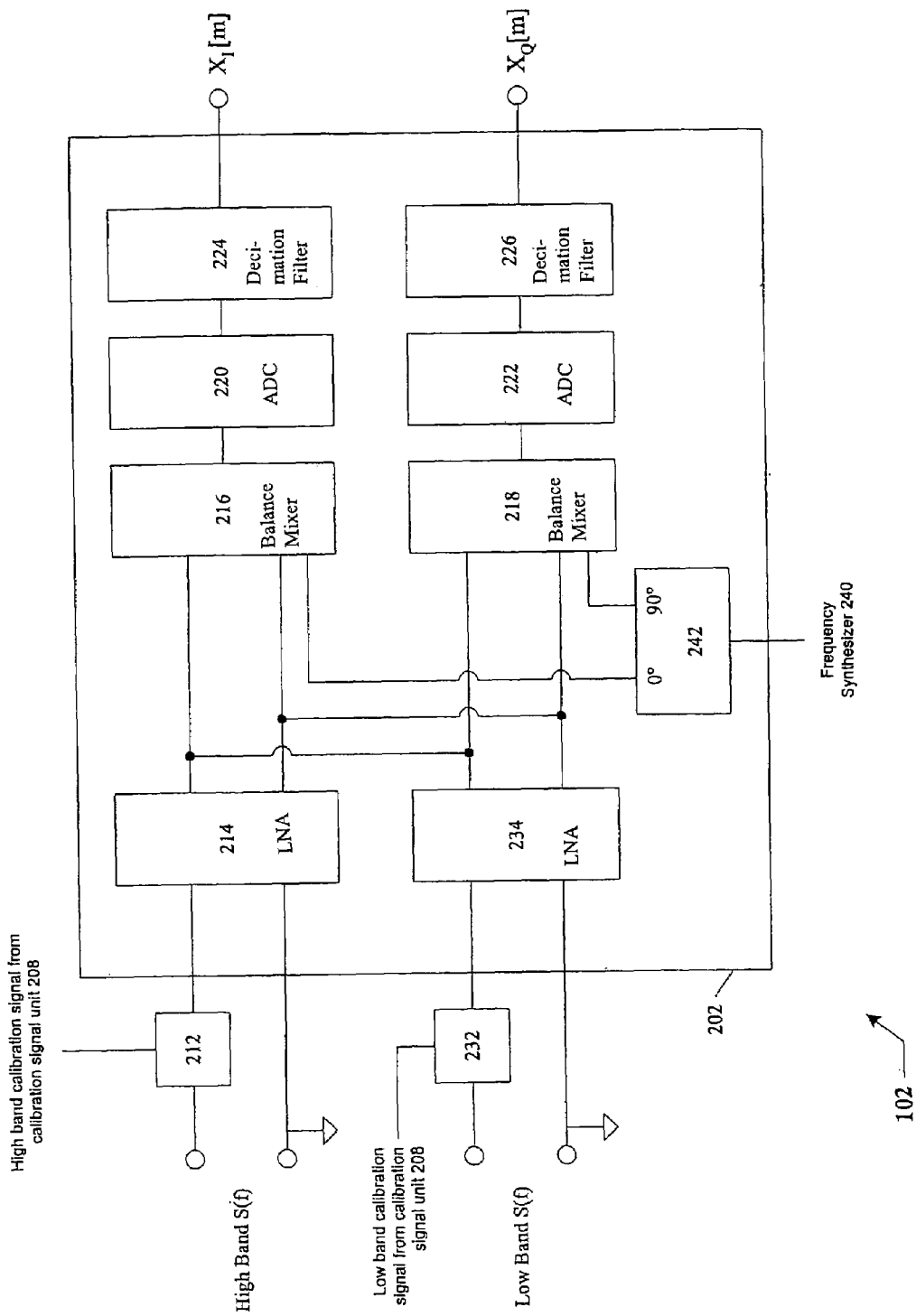
FIG. 2B is a schematic diagram depicting an embodiment of the calibration system within an example dual-band receiver.

FIG. 2B depicts one embodiment of conversion section 202 in a dual-band configuration. In this dual-band embodiment, calibration signal unit 208 generates the calibration signal for each band based upon the frequency of the received signal in that band. Here, the high frequency band is coupled with the high frequency calibration signal at coupler 212 and routed to LNA 214. The low frequency band is coupled with the low frequency calibration signal at coupler 232 and routed to LNA 234. Although not shown in this embodiment, each coupler 212 and 232 can be coupled with a balun configured to convert the single-ended signal to a differential format. Receiver 102 typically only receives on one band at any specific time and therefore, when receiver 102 is receiving a high band signal, LNA 214 amplifies the signal and outputs the I and Q components to mixers 216 and 218. Conversely, when receiver 102 receives in the low band, LNA 234 outputs the I and Q component signals to mixers 216 and 218. From there, the amplified signals are propagated along the I and Q paths in a manner similar to that described above.

Figure 3B:
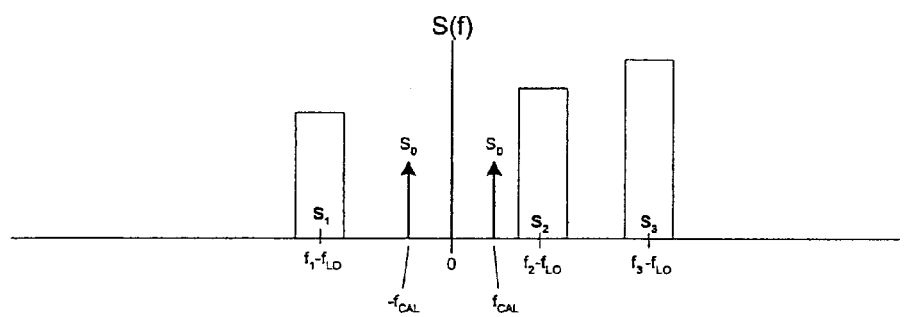
FIG. 3B is a power spectral density graph depicting an example set of signals output from a conversion section.

FIG. 3B depicts the signals present at the output of conversion section 202 after translation and digitization. Here, all of the signals have been translated to the left by $f_{LO}$, such that the calibration signal, $S_0(f)$, is centered around zero, or DC and each of the center frequencies of $S_1(f)$, $S_2(f)$ and $S_3(f)$ are indicated by $f_1 - f_{LO}$, $f_2 - f_{LO}$ and $f_3 - f_{LO}$ negative frequency images $S_1'$, $S_2'$ and $S_3'$ have been translated to the left and are not shown. However, if the I and Q paths have errors in gain and phase, an unwanted signal from the image frequency (not shown) will be created after translation and can potentially interfere with the signal of interest. One of the purposes of calibration is to eliminate these unwanted signals. Also included but not shown are quantization noise, translated LNA thermal noise, and additional noise and harmonics introduced by delta-sigma converters 220 and 222. The noise and interference present at the output of conversion section 202 make isolation and extraction of the calibration signal difficult. A narrowband filter is not sufficient for isolation and extraction because drift in the frequency of the received signal can place the calibration signal outside the bandwidth of the narrowband filter. The coherent reference signal tracks the frequency of the calibration signal and alleviates this difficulty.

Figure 3C:
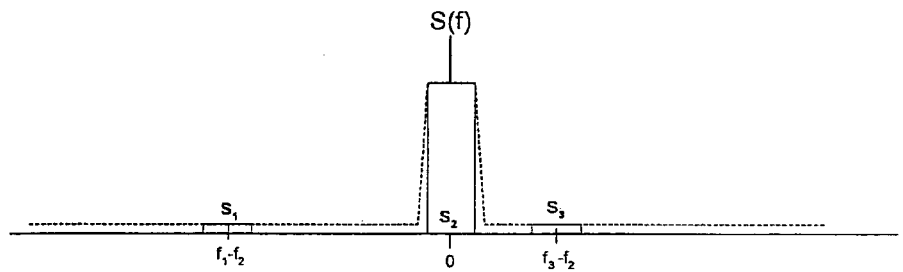
FIG. 3C is a complex power spectral density graph depicting an example set of signals output from a receiver.
Figure 4:
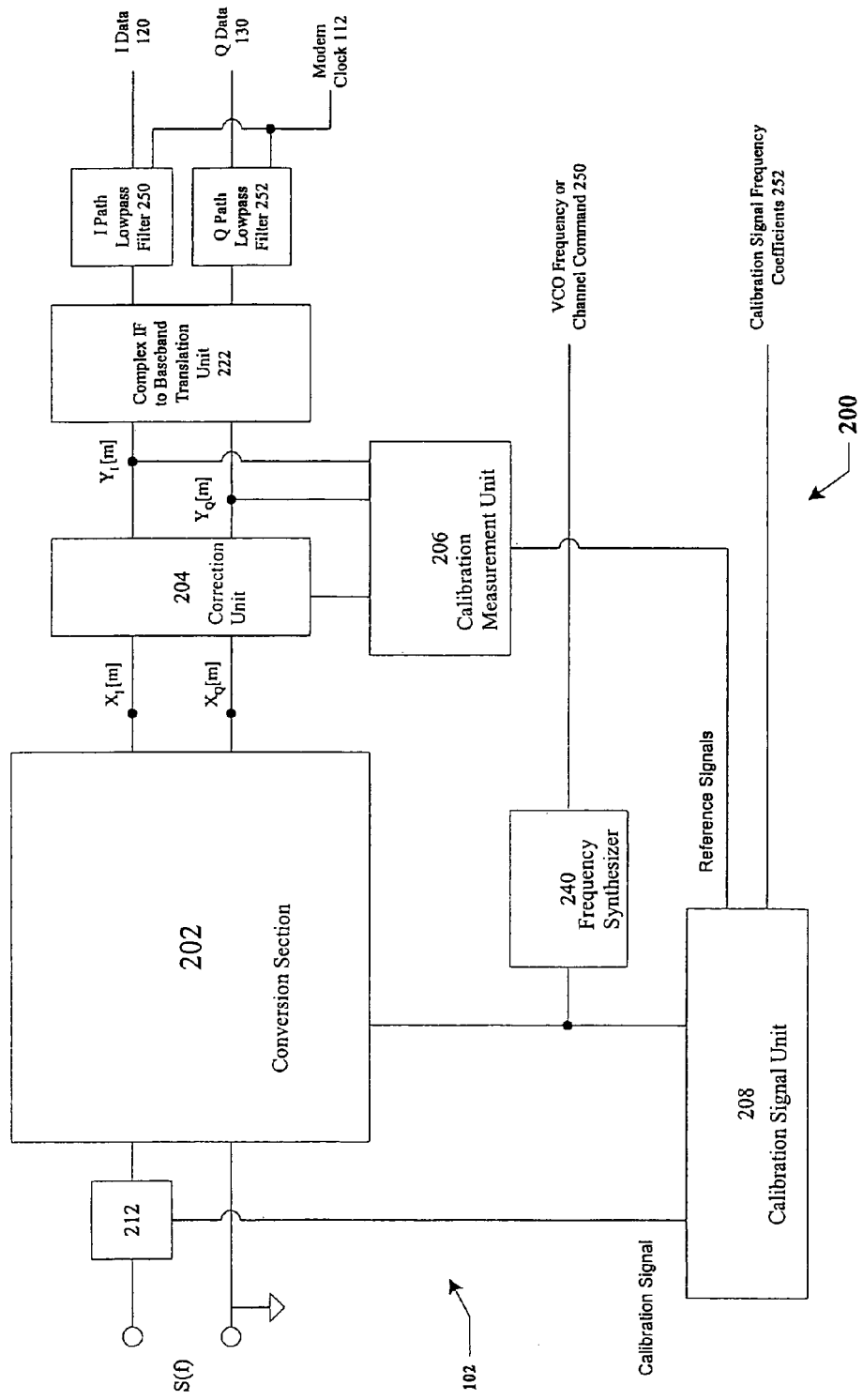
FIG. 4 is a schematic diagram depicting the calibration system integrated into an example receiver system.

FIG. 4 depicts receiver 102 along with complex IF to baseband translation unit 222 and lowpass filters 250 and 252. Complex IF to baseband translation unit 222 translates the I and Q path signals to a baseband frequency which is preferably zero. I and Q path lowpass filters 250 and 252 filter all signals outside of the bandwidth of the signal of interest. The output of these filters, I data signal 120 and Q data signal 130, are depicted in FIG. 3C.

Due to the implementation and design of receiver 102, it is not necessary for calibration system 200 to correct the DC offset error when the IF is set greater than half the two-sided bandwidth of the signal of interest. DC offset correction can be performed in accordance with the needs of the application, but any DC offset present after conversion section 202 can be eliminated without algorithmic correction by using one of several different filtering methods. One such method includes narrowband filtering around the IF frequency in complex IF to baseband translation unit 222, which can eliminate DC components at very low frequency. Also, lowpass filtering with lowpass filters 250 and 252 can also be used to eliminate DC components after these components are translated away from DC during translation of the I and Q signals from IF to baseband.

Figure 5:
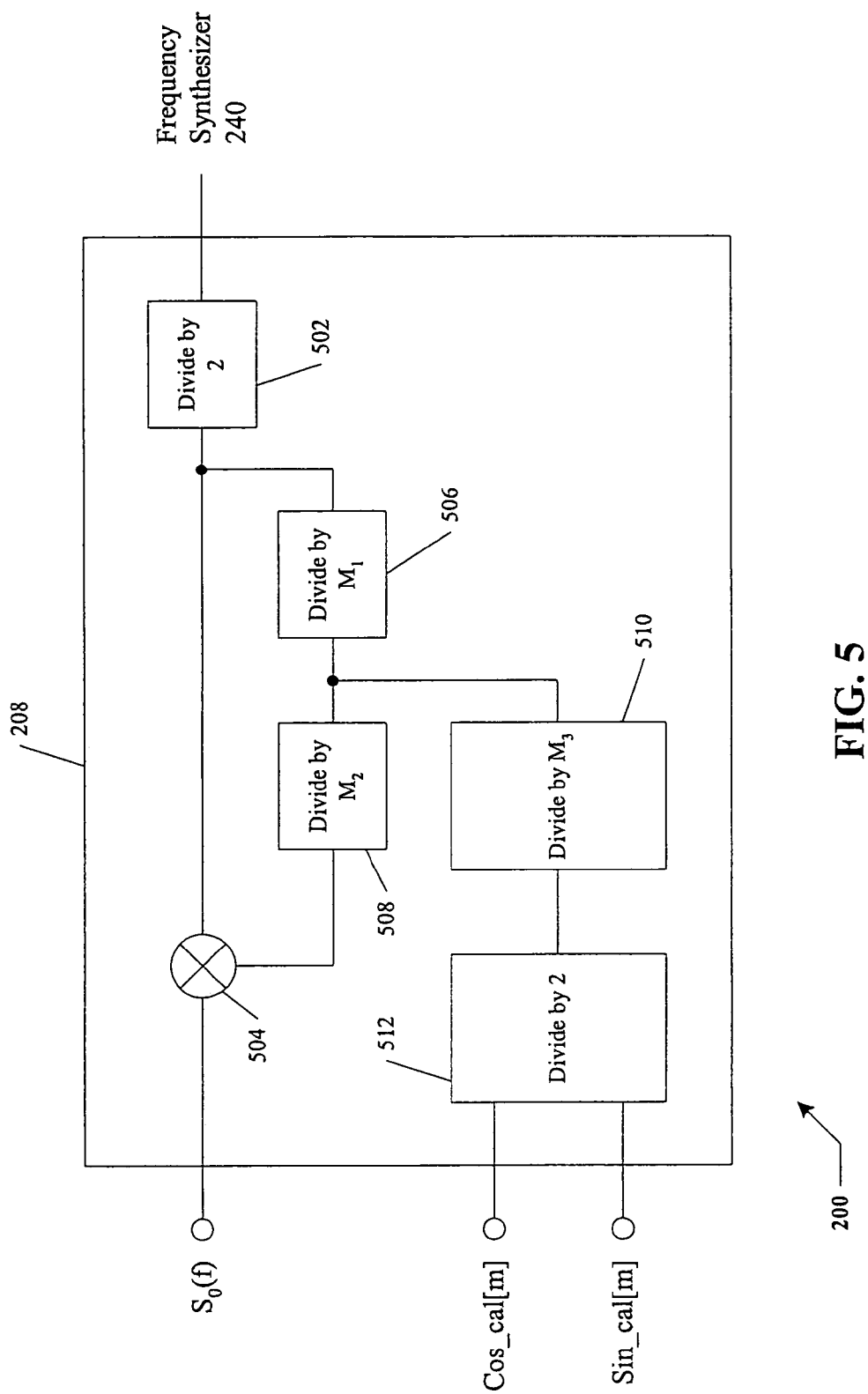
FIG. 5 is a schematic diagram depicting an example calibration signal unit.

The reference signal and the calibration signal are generated by calibration signal unit 208. FIG. 5 depicts an example embodiment of calibration signal unit 208. In this embodiment, calibration signal unit 208 utilizes the output of frequency synthesizer 240 to generate the coherent digital reference signal and the corresponding component reference signals, Sin_Cal[m] and Cos_Cal[m], in addition to $S_0(f)$. By generating both the calibration and reference signals as well as the LO signals all from the same frequency synthesizer 240, calibration system 200 avoids creating the undesirable harmonics and distortion that accompany systems that implement multiple independent oscillators. In addition, the use of only one frequency source is more power efficient than systems that operate with multiple frequency sources, such as both the transmitter and receiver local oscillators.

In this embodiment, the oscillator signal generated by frequency synthesizer 240 is generated at twice the $f_{LO}$ frequency to facilitate the digital phase conversion by phase shifter 242. Frequency synthesizer 240 outputs the digital oscillator signal to divide unit 502, where the signal is divided by two to create a signal at $f_{LO}$ such that:

$$f_{LO}=f_{FS}/2 \qquad (1)$$

wherein:

$f_{LO}$ is the center frequency of the calibration signal, $S_0(f)$; and $f_{FS}$ is the frequency of the oscillator signal of frequency synthesizer 240.

This signal is input to multiplier 504, which is preferably a digital multiplier, and divide unit 506. Divide unit 506 and divide unit 508 divide the $f_{LO}$ signal by M, where $M=M_1 M_2$. M is preferably chosen to place the sidebands of the calibration signal in proximity to, but outside of the bandwidth of the received signal of interest as depicted in FIGS. 3A and 3B.

In one embodiment, $M_1$ and $M_2$ are integers, where $M_1$ is chosen to substantially equal the decimation ratio of decimation filters 224 and 226 and $M_2$ is chosen to place the sideband at the desired frequency. Multiplier 504 multiplies the output of divide unit 508 with the $f_{LO}$ signal to generate the calibration signal, $S_0(f)$. Each sideband of $S_0(f)$ is offset from $f_{LO}$ by $f_{CAL}$, which is given by:

$$f_{CAL}=f_{LO}/M \qquad (2)$$

Each component reference signal is generated at $f_{CAL}$, which, as described above, is $f_{LO}$ divided by M. The output of divide unit 506 is input to divide unit 510 where it is divided by $M_3$. The output of divide unit 510 is input to divide unit 512 where it is divided by 2 and used to generate the quadrature component reference signals Sin_Cal[m] and Cos_Cal[m].

The component reference signals are preferably generated as square waves with a relative phase offset of substantially 90° between them. Square waves are relatively simple to generate and require less power to generate than sinusoidal or other waveforms. However, any waveform, such as a sinewave, can alternatively be used in accordance with the needs of the application. Any higher harmonics generated in the reference signal path can be filtered with a lowpass filter if desired. Because all the signals are derived from the same frequency synthesizer 240, they will track each other, i.e., any drift in $f_{LO}$ will affect both the component reference signals and the calibration signal in the same manner: thus, maintaining their phase coherency. This coherency allows the extraction of the calibration signal from the surrounding noise and harmonics present at the output of conversion section 202.

In this embodiment, $M_3$ is chosen so that $M_3=2 M_2$ in order to facilitate the generation of the quadrature component reference signals. Divide unit 512 can be implemented with a divisor of 4 instead of 2, in which case the 90 degree phase offset between the two component reference signals could be generated by using only the rising edge of the input signal. However, this would require the input signal to operate at twice the frequency than in the current embodiment. The divisor of 2 used in divide unit 512 requires both the rising and falling edges of the input signal be used to generate the phase offset, in which case a sufficiently symmetrical input signal is desired to generate the proper phase offset.

Figure 6A:
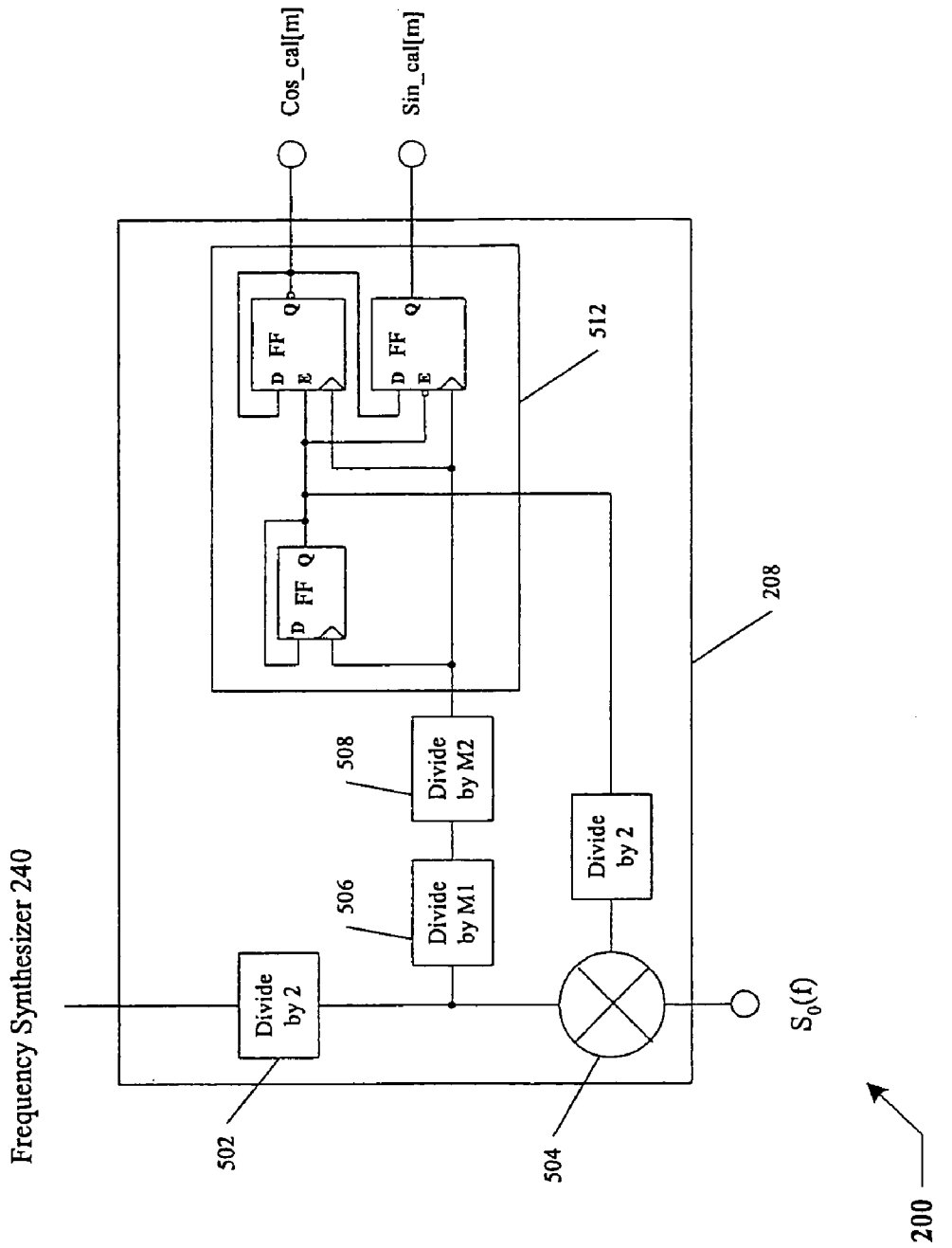
FIG. 6A is a schematic diagram depicting another example calibration signal unit.
Figure 6B:
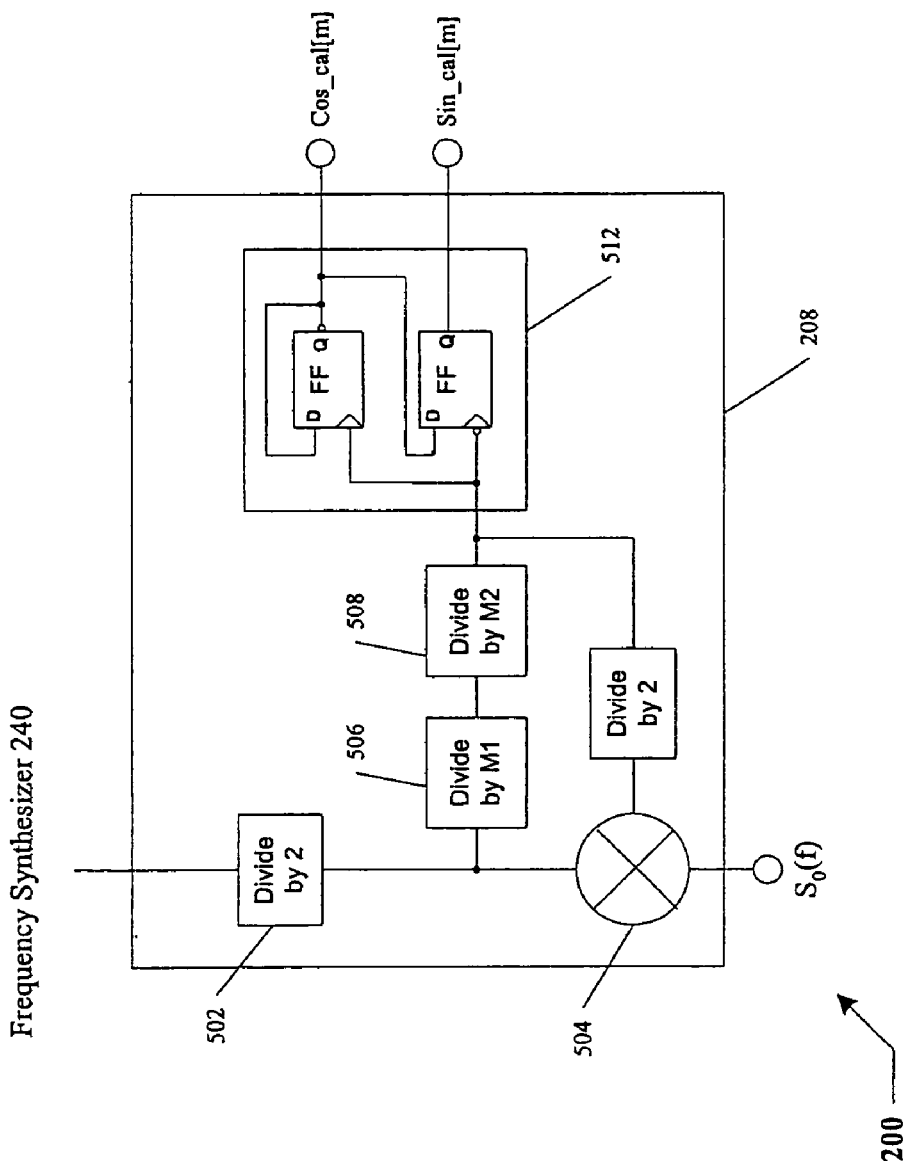
FIG. 6B is a schematic diagram depicting another example calibration signal unit.

FIGS. 6A–B depict two embodiments of calibration signal unit 208 using D flip-flops to generate the reference signal. In the preferred embodiment depicted in FIG. 6A, calibration signal unit 208 includes divide unit 512, which divides the output of divide unit 508 by 4 to generate the square wave component reference signals. Divide unit 512 also delays the output of the component reference signals to coincide with the propagation of the calibration signal through conversion section 202. FIG. 6B depicts another embodiment of calibration signal unit 208 where divide unit 512 divides the output of divide unit 508 by 2 and delays the output of the component reference signals so that the m sample of the reference signals coincides with that of the translated and digitized calibration signal. One of skill in the art will readily recognize that these embodiments can be implemented with programmable logic to allow the value of $M_2$ to be programmed according to the needs of the application.

Figure 7:
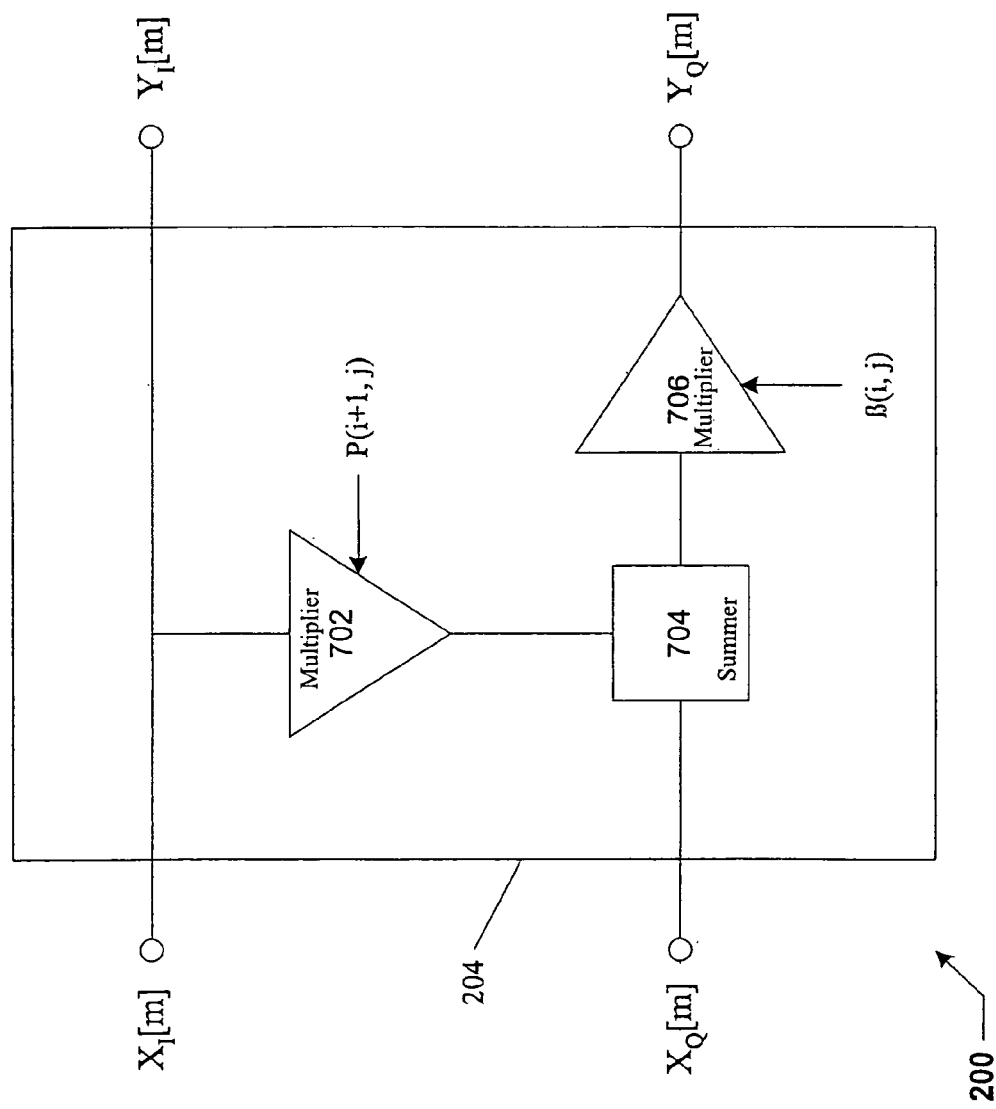
FIG. 7 is a schematic diagram depicting an example correction unit.

Referring back to FIG. 2A, any gain and phase errors present in $X_I[m]$ and $X_Q[m]$ are corrected with correction unit 204. FIG. 7 depicts an example embodiment of correction unit 204. I and Q output signals $X_I[m]$ and $X_Q[m]$ are input to correction unit 204 and output as phase and gain corrected signals $Y_I[m]$ and $Y_Q[m]$. As mentioned above, it is not necessary to correct for the DC offset because of the design of receiver 102 and accordingly, only the gain and phase error are corrected with correction unit 204. Within correction unit 204, the phase error is preferably corrected prior to correcting the gain error. Correcting the error in this order allows the calibration system 200 to operate at a faster rate. Phase correction can alter the amplitude of the signal being corrected and any amplitude correction performed prior to phase correction can be lost. Conversely, in this embodiment of correction unit 204 the amplitude correction does not have a substantial effect on the phase correction and therefore, correcting the phase first allows the iterative correction of both phase and amplitude to converge to the desired level at a faster rate. In another embodiment, phase and amplitude correction are performed concurrently.

In the embodiment illustrated in FIG. 7, the I signal sample, $X_I[m]$, is input to multiplier 702 where, for the i-th iteration, it is multiplied by a phase correction parameter, $P(i, j)$. The j-th parameter identifies the frequency channel, band, or region which is being corrected. The product output from multiplier 702 is then summed with the Q signal sample, $X_Q[m]$, by summer 704. The summed signal is then input to multiplier 706 where it is multiplied with a gain correction parameter, $\beta(i, j)$, which is also discussed in more detail below. The resulting product, $Y_Q[m]$, is a phase and gain corrected version of $X_Q[m]$ and is gain balanced and in quadrature with $Y_I[m]$. The outputs of correction unit 204 are given by:

$$Y_I[m] = X_I[m] \quad (3)$$

$$Y_Q[m] = \beta(i, j)[X_Q[m] + (P(i, j)X_I[m])] \quad (4)$$

wherein:
$\beta(i, j)$ is the value of the i-th gain calibration parameter for the in-phase path at the j-th frequency of the calibration signal;
$P(i, j)$ is the value of the i-th phase calibration parameter for the quadrature path at the j-th frequency of the calibration signal.

In this embodiment, the signals $X_I[m]$ and $Y_I[m]$ are substantially the same because the phase and error corrections are made only to $X_Q[m]$. In this manner, the phase and gain of $X_Q[m]$ are adjusted relative to $X_I[m]$. The phase of $X_Q[m]$ is corrected to bring it closer to a 90° phase offset from $X_I[m]$ and the amplitude of $X_Q[m]$ is adjusted to bring it closer to the amplitude of $X_I[m]$. The selection of which signal to adjust is dependent upon the needs of the application. Calibration system 200 can be readily reconfigured so that $X_I[m]$ is corrected relative to $X_Q[m]$.

Calibration measurement unit 206 is coupled with correction unit 204 and coherently measures the gain and phase error present in the corrected signals $Y_I[m]$ and $Y_Q[m]$. Calibration system 200 operates iteratively because any one correction of a sample of $X_I[m]$ and $X_Q[m]$ may not reduce the gain and phase error to the desired level. The error present in the corrected signals $Y_I[m]$ and $Y_Q[m]$ is measured and used to determine the calibration parameters for the next iteration.

Figure 8:
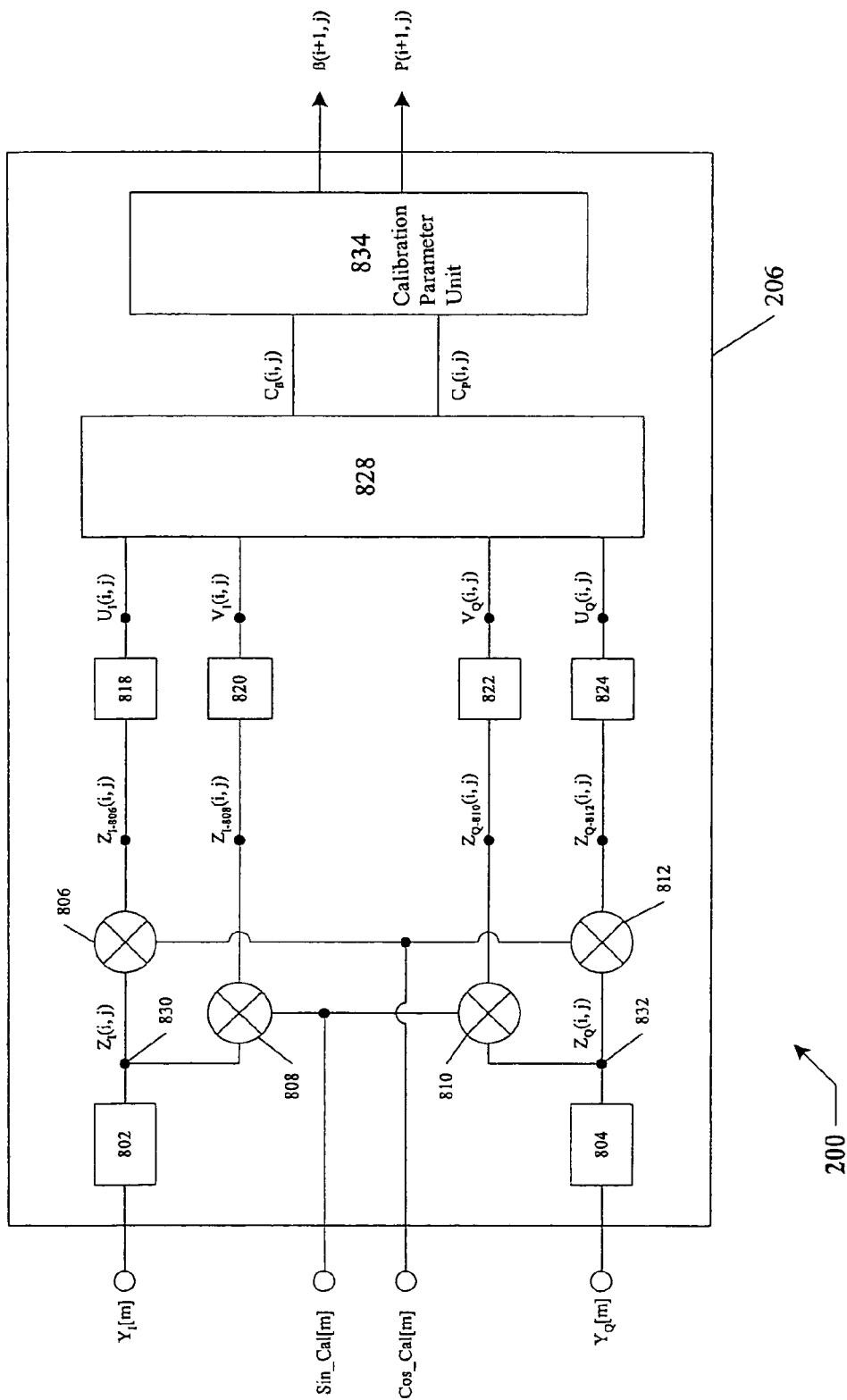
FIG. 8 is a schematic diagram depicting an example calibration measurement unit.

FIG. 8 depicts an example embodiment of calibration measurement unit 206. Calibration measurement unit 206 takes error measurements, $C_\beta(i, j)$ and $C_P(i, j)$ and algorithmically generates the calibration parameters with calibration parameter unit 834. In this embodiment, $Y_I[m]$ and $Y_Q[m]$ are filtered by low-pass prefilters 802 and 804 respectively, which have cutoff frequencies marginally greater than the frequency of the calibration signal, $f_{CAL}$. Filters 802 and 804 can be any filter with frequency attenuation suitable for the needs of the application, including a low-pass or a band-pass filter. In one embodiment, filters 802 and 804 are low-pass filters with a single sided bandwidth greater than $|f_{CAL}|$ and with sufficient attenuation to reject frequencies above 2 $|f_{CAL}|$. The amount of rejection of these frequencies is dependent on the level of image rejection desired in the application and the level of spurious harmonics created from the calibration signal. One of skill in the art will readily recognize other embodiments where filters 802 and 804 are not utilized.

$Y_I[m]$ and $Y_Q[m]$ both contain the translated and digitized calibration signal at $f_{CAL}$. Calibration measurement unit 206 coherently extracts the calibration signal by multiplying $Y_I[m]$ and $Y_Q[m]$ with the component reference signals, which are also operating at $f_{CAL}$. The prefiltering ensures that the signal of interest, $S_2(f)$, as well as unwanted interference and harmonics, are not multiplied with any upper harmonics present in the reference path. The I path filtered signal is then multiplied with the Cos_cal[m] and the Sin_cal[m] reference signals at multipliers 806 and 808, respectively, while the Q path filtered signal is multiplied with the Sin_cal[m] and the Cos_cal[m] reference signals at multipliers 810 and 812, respectively. The multiplication of these various signals extracts the calibration signal and creates DC components that are frequency independent and can be used to measure the gain and phase error present in the I and Q signals. Because of this, calibration measurement unit 206 does not need scale accuracy, but preferably has a stable zero frequency reference point to allow accurate generation of the DC component. Preferably, the reference signal m sample is generated during the same sampling time ($T_S$) as the I and Q path filtered signal m sample. The use of the same corresponding m samples will obtain the most accurate calibration.

The calibration measurement process can be performed using any number of I and Q signal samples depending on the level of accuracy required as well as the speed of wireless system 100. In many embodiments, calibration is performed using a pre-determined series of samples, e.g., one calibration measurement is taken for a series of two or more samples of $Y_I[m]$ and $Y_Q[m]$. This sacrifices some resolution in exchange for reliability in the calibration process as individual samples are more subject to short-lived deviations created by such variables as noise and power spikes. The length of the series is dependent upon the needs of the application and can be fixed or programmable as desired.

The products of the I and Q path signals are then summed by summation units 818–824. In this embodiment, summation units 818–824 are digital intergrate and dump filters. These may be implemented with lowpass filters such as finite impulse response (FIR) or infinite impulse response (IIR) filters, preferably with a single sided bandwidth greater than $|f_{CAL}|$ and with sufficient attenuation to reject frequencies above $2 |f_{CAL}|$. In addition, any DC component present in $Y_I[m]$ and $Y_Q[m]$ is multiplied to a multiple of $f_{CAL}$ by multipliers 806–812 and can then be filtered by summation units 818–824. In the preferred embodiment, summation units 818–824 are reset after every filtering and summation operation. In other embodiments, summation units 818–824 can also be analog or digital integrators or other summing logic. In this embodiment, the output of multiplier 806 is coupled with integrator 818 and generates $U_I(i, j)$. Multipliers 808, 810 and 812 are coupled with summation units 820, 822 and 824, and generate $V_I(i, j)$, $V_Q(i, j)$ and $U_Q(i, j)$, respectively. $U_I(i, j)$, $V_I(i, j)$, $V_Q(i, j)$ and $U_Q(i, j)$ are given by:

$$U_I(i, j) = \sum_{m=k}^{k+K-1} Y_I[m] \, \text{Cos\_Cal}[m] \quad (5)$$

$$V_I(i, j) = \sum_{m=k}^{k+K-1} Y_I[m] \, \text{Sin\_Cal}[m] \quad (6)$$

$$V_Q(i, j) = \sum_{m=k}^{k+K-1} Y_Q[m] \, \text{Sin\_Cal}[m] \quad (7)$$

$$U_Q(i, j) = \sum_{m=k}^{k+K-1} Y_Q[m] \, \text{Cos\_Cal}[m] \quad (8)$$

wherein:
k is the first sample in the summation;
K is the number of samples in the measurement which starts at m=k.

$U_I(i, j)$, $V_I(i, j)$, $V_Q(i, j)$ and $U_Q(i, j)$ are then input to measurement unit 828, which calculates the value of the gain and phase error measurements, $C_G(i, j)$ and $C_P(i, j)$. $C_\beta(i, j)$ and $C_P(i, j)$ are given by:

$$C_\beta(i,j) = U_I(i,j) - U_Q(i,j) - V_I(i,j) - V_Q(i,j) \quad (9)$$

$$C_P(i,j) = (U_I(i,j)U_Q(i,j)) + (V_I(i,j)V_Q(i,j)) \quad (10)$$

wherein:
$C_\beta(i, j)$ is the value of the i-th gain measurement at the j-th frequency of the calibration signal;
$C_P(i, j)$ is the value of the i-th phase measurement at the j-th frequency of the calibration signal;
k is the first sample in the summation;
K is the number of samples in the measurement which starts at m=k.

The following example embodiment illustrates the operation of calibration measurement unit 206. In this embodiment, the calibration signal is given by:

$$S_0(t) = A \cos(\omega_0 t + \phi)$$

wherein:
$\omega_0$ is the frequency of the calibration signal in radians;
$\phi$ is the phase of the calibration signal in radians; and
A is the voltage amplitude of the calibration signal.

After translation by $f_{LO}$, digitization and decimation filtering by conversion section 202, the resulting output signals of low-pass filters 802 and 804 in calibration measurement unit 206 are given by:

$$Z_I[m] = A \, G_I \cos([\omega_0 - \omega_{LO}] T_S m + \phi + \theta_I)$$

$$Z_Q[m] = A \, G_Q \sin([\omega_0 - \omega_{LO}] T_S m + \phi + \theta_Q)$$

wherein:
$G_I$ is the I path gain from the output of coupler 212 to output 830 of low-pass filter 802;
$\theta_I$ is the I path phase shift from the output of coupler 212 to output 830 of low-pass filter 802;
$G_Q$ is the Q path gain from the output of coupler 212 to output 832 of low-pass filter 804;
$\theta_Q$ is the Q path phase shift from the output of coupler 212 to output 832 of low-pass filter 804;
$\omega_{LO}$ is the frequency $f_{LO}$ in radians, where $\omega_{LO} = 2\pi f_{LO}$; and
$T_S$ is the sampling time of ADCs 220 and 222.

After translation by $\omega_{LO}$, the sidebands of the calibration signal are at $\omega_{CAL}$, and the outputs of multipliers 806, 808, 810 and 812 in calibration measurement unit 206 are given by:

$$Z_{I\text{-}806}[m] = A \, G_I \cos[(\omega_0 - \omega_{LO})T_S m + \phi + \theta_I] \cos[\omega_{CAL} T_S m]$$

$$= A \, G_I \left\{ \frac{1}{2} \cos[\omega_{CAL} T_S m + \phi + \theta_I + \omega_{CAL} T_S m] + \right.$$

$$\left. \frac{1}{2} \cos[\omega_{CAL} T_S m + \phi + \theta_I - \omega_{CAL} T_S m] \right\}$$

$$= A \, G_I \left\{ \frac{1}{2} \cos[2 \omega_{CAL} T_S m + \phi + \theta_I] + \frac{1}{2} \cos[\phi + \theta_I] \right\}$$

$$Z_{I\text{-}808}[m] = A \, G_I \cos[(\omega_0 - \omega_{LO})T_S m + \phi + \theta_I] \sin[\omega_{CAL} T_S m]$$

$$= A \, G_I \left\{ \frac{1}{2} \sin[\omega_{CAL} T_S m + \phi + \theta_I + \omega_{CAL} T_S m] + \right.$$

$$\left. \frac{1}{2} \sin[\omega_{CAL} T_S m + \phi + \theta_I - \omega_{CAL} T_S m] \right\}$$

$$= A \, G_I \left\{ \frac{1}{2} \sin[2 \omega_{CAL} T_S m + \phi + \theta_I] - \frac{1}{2} \sin[\phi + \theta_I] \right\}$$

$$Z_{Q\text{-}810}[m] = A \, G_Q \sin[(\omega_0 - \omega_{LO})T_S m + \phi + \theta_Q] \sin[\omega_{CAL} T_S m]$$

$$= A \, G_Q \left\{ \frac{1}{2} \cos[\omega_{CAL} T_S m + \phi + \theta_Q - \omega_{CAL} T_S m] - \right.$$

$$\left. \frac{1}{2} \cos[\omega_{CAL} T_S m + \phi + \theta_Q + \omega_{CAL} T_S m] \right\}$$

$$= A \, G_Q \left\{ \frac{1}{2} \cos[\phi + \theta_Q] - \frac{1}{2} \cos[2 \omega_{CAL} T_S m + \phi + \theta_Q] \right\}$$

$$Z_{Q\text{-}812}[m] = A \, G_Q \sin[(\omega_0 - \omega_{LO})T_S m + \phi + \theta_Q] \cos[\omega_{CAL} T_S m]$$

$$= A \, G_Q \left\{ \frac{1}{2} \sin[\omega_{CAL} T_S m + \phi + \theta_Q + \omega_{CAL} T_S m] + \right.$$

$$\left. \frac{1}{2} \sin[\omega_{CAL} T_S m + \phi + \theta_Q - \omega_{CAL} T_S m] \right\}$$

$$= A \, G_Q \left\{ \frac{1}{2} \sin[2 \omega_{CAL} T_S m + \phi + \theta_Q] + \frac{1}{2} \sin[\phi + \theta_Q] \right\}$$

wherein:
$\omega_{CAL}$ is the frequency $f_{CAL}$ in radians.

Summation units 818, 820, 822 and 824 filter out the 2 $\omega_{CAL}$ component, and the respective outputs to are given by:

$U_I[m]$=Low Pass filtered version of $Z_{I\text{-}806}[m]$=$A\, G_I\, W \cos(\phi+\theta_I)$ $V_I[m]$=Low Pass filtered version of $Z_{I\text{-}808}[m]$=$-A\, G_I\, W \sin(\phi+\theta_I)$ $V_Q[m]$=Low Pass filtered version of $Z_{I\text{-}810}[m]$=$A\, G_Q\, W \cos(\phi+\theta_Q)$ $U_Q[m]$=Low Pass filtered version of $Z_{I\text{-}812}[m]$=$A\, G_Q\, W \sin(\phi+\theta_Q)$ wherein:
W is the composite gain of multipliers 806–812 and summation units 818–824.

These signals are then input to output measurement unit 828, where the gain error and phase error measurements are generated. The gain error measurement from equation (9) is given by:

$$\begin{aligned}
C_\beta(i,j) &= U_I(i) - U_Q(i) - V_I(i) - V_Q(i) \\
&= A\, W\, \{[G_I \cos(\phi+\theta_I) - G_Q \sin(\phi+\theta_Q)] + \\
&\quad [G_I \sin(\phi+\theta_I) - G_Q \cos(\phi+\theta_Q)]\} \\
&= A\, W\, \{G_I\, [\cos(\phi+\theta_I) + \sin(\phi+\theta_I)] - \\
&\quad G_Q[\cos(\phi+\theta_Q) + \sin(\phi+\theta_Q)]\}
\end{aligned}$$

When there is no quadrature phase error, i.e., $\theta_I=\theta_Q$, then $$C_\beta(i,j) = A\, W\, \{[G_I - G_Q][\cos(\phi+\theta_I)+\sin(\phi+\theta_I)]\}$$

The value of the gain error measurement, $C_\beta(i+1,j)$, can be zero if at least one of two conditions occur. First, when either the amplitude of the I path signal is the same as the amplitude of the Q path signal, i.e., $G_I=G_Q$, or second, $$[\cos(\phi+\theta_I)+\sin(\phi+\theta_I)]=0,$$

which occurs when $(\phi+\theta_I)$ equals 135°, 225° or these values plus multiples of 360°. This second condition is not likely to exist. However, in the event that this second condition does exist, a phase shift of 180° can be added to the reference signal in calibration signal unit 208 to correct for it.

The phase error measurement from equation (10) is given by:

$$\begin{aligned}
C_P(i,j) &= (U_I(i)\, U_Q(i)) + (V_I(i)\, V_Q(i)) \\
&= [A^2\, G_I\, G_Q\, W^2]\, \{[\cos(\phi+\theta_I)\sin(\phi+\theta_Q)] - \\
&\quad [\sin(\phi+\theta_I)\cos(\phi+\theta_Q)]\} \\
&= [A^2\, G_I\, G_Q\, W^2]\, \sin(\theta_I-\theta_Q).
\end{aligned}$$

Calibration measurement unit 206 calculates the calibration parameters using calibration parameter unit 834. Calibration parameter unit 834 can be configured to utilize the gain and phase error measurements in a set of adaptive calibration algorithms to generate the calibration parameters, $\beta(i,j)$ and $P(i,j)$. During operation of wireless system 100, the values of the calibration parameters are preferably iteratively updated until the desired reduction of phase and gain error is achieved. To do this, the adaptive calibration algorithms adjust the values of the calibration parameters so that the average value of the gain and phase errors approach zero or a desired lower level. In the example embodiment, each algorithm uses a decay constant and a correction term to produce the calibration parameters, which are given by:

$$\beta(i+1,j)=\rho_\beta \beta(i,j)+\gamma_\beta C_\beta(i,j) \tag{11}$$

wherein:
$\rho_\beta$ is the gain decay constant with a value of less than one;
$\gamma_\beta$ is the gain correction term;

$$P(i+1,j)=\rho_P P(i,j)+\gamma_P C_P(i,j) \tag{12}$$

wherein:
$\rho_P$ is the phase decay constant with a value of less than one;
$\gamma_P$ is the phase correction term;

The values of the decay constants, $\rho_\beta$ and $\rho_P$, are based upon the degree of image cancellation required by the application and the correlated noise between the I and Q paths with calibration measurement unit 206. The value of the correction terms, $\gamma_\beta$ and $\gamma_P$, are based upon the speed convergence and the degree of image cancellation required by the application. In one embodiment, the adaptive calibration algorithm implements a stochastic gradient algorithm where the delay constants and the correction gain terms are tailored to the noise levels of receiver 102. Further information concerning stochastic gradient algorithms can be found in Masenten, W. K., *Adaptive Signal Processing, Case Studies in Advanced Signal Processing*, IEEE Conference Publication Number 180, Peebles, Scotland, 1979, pp. 168–177, which is expressly incorporated by reference herein. Calibration measurement unit 206 also may interface with a memory in order to store and retrieve the calibration parameters as desired. Wireless system 100 can operate in one of two operational modes: standard operation mode and calibration mode. In standard operation mode, wireless system 100 does not measure the levels of phase and gain error and receive concurrently. Instead, in order to calibrate the I and Q signals, calibration measurement unit 206 interfaces with a memory, either internal or external to the receiver, and retrieves the calibration parameters generated at the frequency closest to the current operating frequency.

In calibration mode, receiver 102 iteratively measures and calculates updated parameters in order to adapt to the current operating conditions. This mode is preferably performed while the receiver is receiving a signal from a remote transmitter, but can also be performed by itself without concurrent reception. Any previously generated calibration parameters are preferably stored in a memory, where they can be indexed according to the needs of the application. The indexing can be done by the frequency of the calibration signal, the frequency of the received signal, or any other value that facilitates the location and selection of the appropriate calibration parameter. In addition, the adaptive algorithms themselves are based on the value of previous calibration parameters and they interface with a memory to store and retrieve parameters for this purpose. In instances where no previous calibration parameter is available, a default parameter can be stored and used in place of a previously generated parameter or an estimated calibration parameter can be generated algorithmically.

Figure 9:
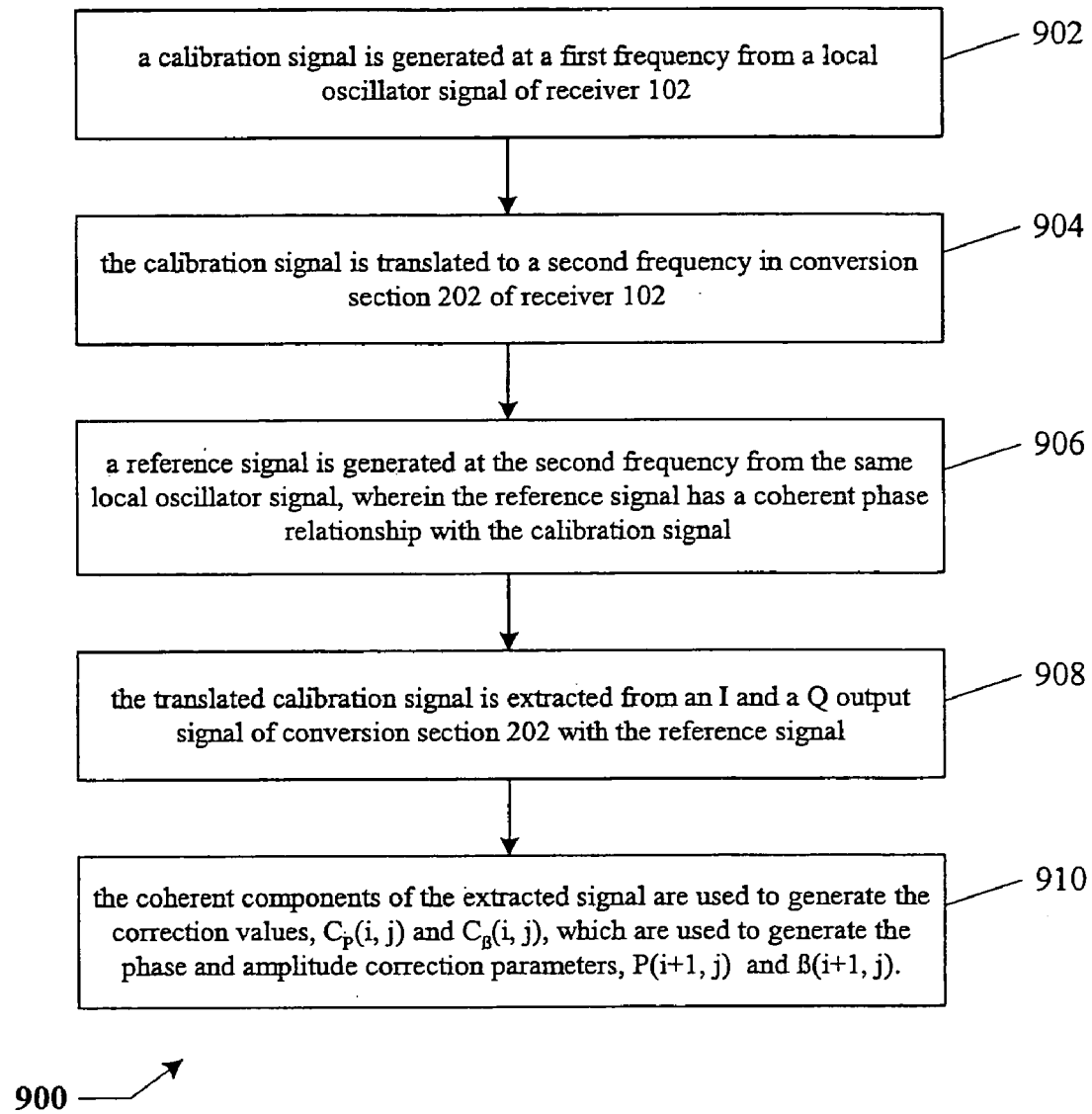
FIG. 9 is flow chart depicting an example method of calibrating a receiver.

FIG. 9 depicts an example embodiment of improved method 900 of calibrating receiver 102. At 902, a calibration signal is generated at a first frequency from a local oscillator signal of receiver 102. At 904, the calibration signal is translated to a second frequency in conversion section 202 of receiver 102. Then at 906, a reference signal is generated at the second frequency from the same local oscillator signal, wherein the reference signal has a coherent phase relationship with the calibration signal. At 908, the translated calibration signal is extracted from an I and a Q output signal of conversion section 202 with the reference signal. Finally, at 910 the coherent components of the extracted signal are used to generate the correction values, $C_P(i, j)$ and $C_\beta (i, j)$, which are used to generate the phase and amplitude correction parameters, $P(i+1, j)$ and $\beta (i+1, j)$.

Figure 10:
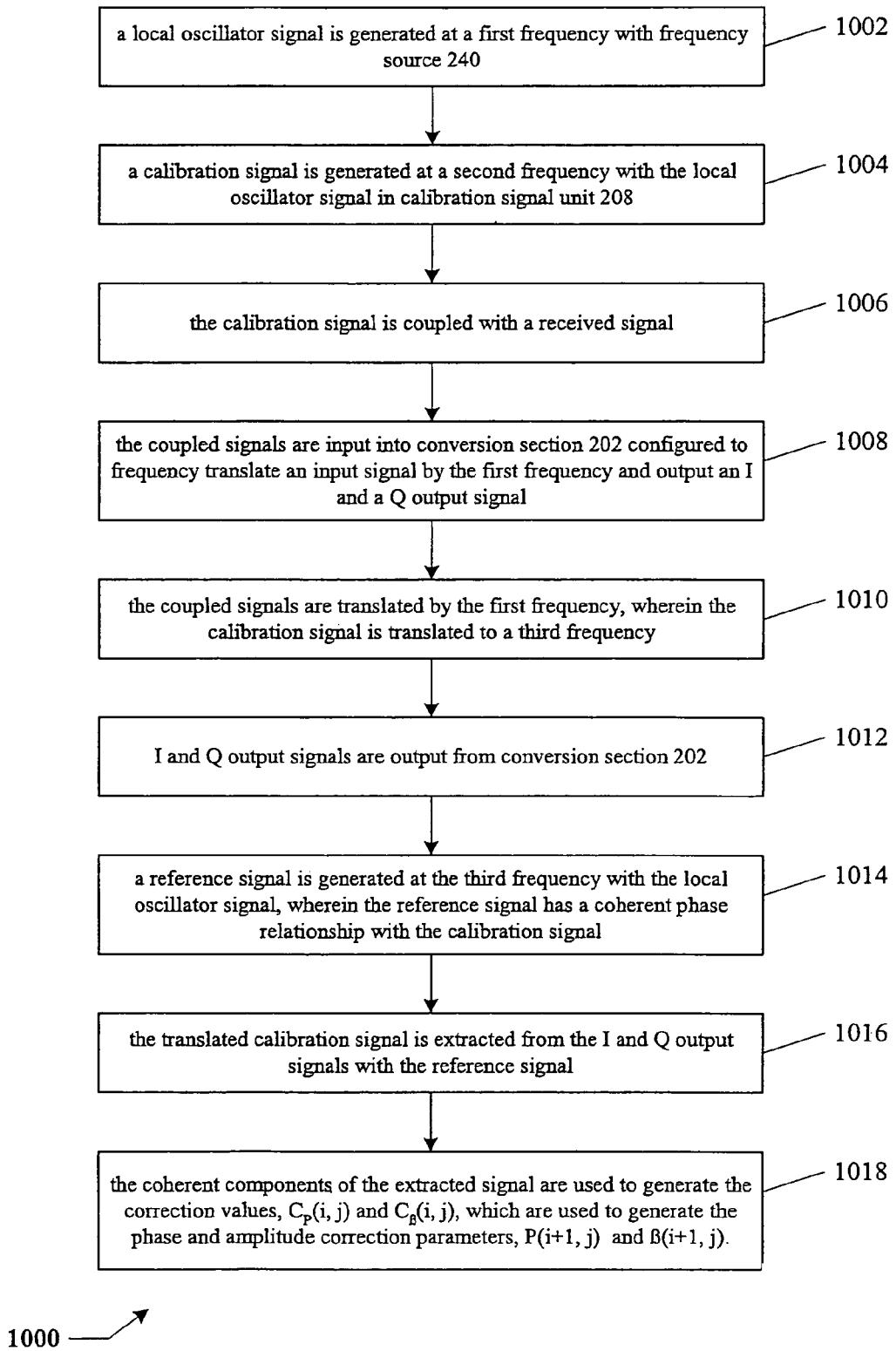
FIG. 10 is flow chart depicting another example method of calibrating a receiver.

FIG. 10 depicts another embodiment of improved method 1000 for calibrating receiver 102. At 1002, a local oscillator signal is generated at a first frequency with frequency source 240. At 1004, a calibration signal is generated at a second frequency with the local oscillator signal in calibration signal unit 208. At 1006, the calibration signal is coupled with a received signal. At 1008, the coupled signals are input into conversion section 202 configured to frequency translate an input signal by the first frequency and output an I and a Q output signal. Then, at 1010, the coupled signals are translated by the first frequency, wherein the calibration signal is translated to a third frequency. At 1012, I and Q output signals are output from conversion section 202. Next, at 1014 a reference signal is generated at the third frequency with the local oscillator signal, wherein the reference signal has a coherent phase relationship with the calibration signal. At 1016, the translated calibration signal is extracted from the I and Q output signals with the reference signal. Finally, at 1018 the coherent components of the extracted signal are used to generate the correction values, $C_P(i, j)$ and $C_\beta(i, j)$, which are used to generate the phase and amplitude correction parameters, $P(i+1, j)$ and $\beta(i+1, j)$.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, unless otherwise stated, and the invention can be performed using different or additional process actions, or a different combination or ordering of process actions. As another example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. A method for calibrating the in-phase (I) and quadrature (Q) path output signals of a receiver, comprising:
generating a calibration signal at a first frequency from a local oscillator signal of a receiver;
coupling the calibration signal with a received transmitted signal;
translating the calibration signal to a second frequency in a conversion section of the receiver;
generating a reference signal at the second frequency from the same local oscillator signal, wherein the reference signal has a coherent phase relationship with the calibration signal; and
extracting the translated calibration signal from an I and a Q output signal of the conversion section with the reference signal.

2. The method of claim 1, wherein the conversion section is configured to translate an input signal by a third frequency.

3. The method of claim 2, wherein the conversion section is configured to sample the input signal at a rate based upon by the third frequency.

4. The method of claim 3, wherein the third frequency is the frequency of the local oscillator signal.

5. The method of claim 4, wherein the local oscillator signal is generated with a frequency source of the receiver.

6. The method of claim 1, further comprising measuring an error in gain between the I and Q output signal using the extracted calibration signal.

7. The method of claim 6, further comprising generating a gain calibration parameter from the gain error measurement.

8. The method of claim 7, further comprising correcting the gain between the I and Q output signals with the gain calibration parameter.

9. The method of claim 1, further comprising correcting the gain between the I and Q output signals with a gain calibration parameter.

10. The method of claim 9, further comprising measuring an error in gain between the corrected I and Q output signal with the extracted calibration signal.

11. The method of claim 10, further comprising generating a next gain calibration parameter from the gain error measurement.

12. The method of claim 1, further comprising measuring an error in phase between the I and Q output signals with the extracted calibration signal.

13. The method of claim 12, further comprising generating a phase calibration parameter from the phase error measurement.

14. The method of claim 13, further comprising correcting the phase between the I and Q output signals with the phase calibration parameter.

15. The method of claim 1, further comprising correcting the phase between the I and Q output signals with a phase calibration parameter.

16. The method of claim 15, further comprising measuring an error in phase between the corrected I and Q output signal using the extracted calibration signal.

17. The method of claim 16, further comprising generating a next phase calibration parameter from the phase error measurement.

18. The method of claim 1, wherein extracting the translated calibration signal comprises multiplying an I and a Q output signal with the reference signal.

19. The method of claim 1, further comprising receiving a transmitted signal concurrently with calibrating the I and Q path output signals.

20. The method of claim 1, further comprising measuring an error in phase and an error in gain between the I and Q output signals using the extracted calibration signal.

21. The method of claim 20, further comprising:
generating a phase calibration parameter from the phase error measurement;
generating a gain calibration parameter from the gain error measurement;
correcting the phase between the I and Q output signals with the phase calibration parameter; and
correcting the gain between the phase corrected I and Q output signals with the gain calibration parameter.

22. The method of claim 21, wherein the I and Q output signals comprise an I and a Q digitized output signal sample.

23. The method of claim 22, wherein the reference signal comprises a digitized reference signal sample.

24. The method of claim 23, wherein the reference signal sample corresponds to the same I and Q output signal sample when the reference signal sample is used to extract the translated calibration signal from the I and Q output signal samples.

25. The method of claim 22, wherein the gain and phase calibration parameters correspond to the error measurements between a first I and Q signal sample, and wherein the gain and phase calibration parameters are applied to a second I and Q signal sample.

26. The method of claim 1, wherein the first frequency signal is outside a bandwidth of a received signal.

27. The method of claim 1, wherein the first frequency is in proximity to a received signal frequency.

28. The method of claim 1, further comprising receiving the transmitted signal concurrently with measuring phase and gain error using the extracted calibration signal.

29. The method of claim 1, wherein extracting the translated calibration signal from an I and a Q output signal of the conversion section comprises multiplying the reference signal with the I and Q output signal of the conversion section.

30. The method of claim 29, further comprising measuring an error in gain between the I and Q output signal using the extracted calibration signal.

31. The method of claim 30, wherein measuring the error in gain between the I and Q output signal comprises filtering out a DC component from the multiplication of the reference signal with the I and Q output signal.

32. The method of claim 29, further comprising measuring an error in phase between the I and Q output signal with the extracted calibration signal.

33. The method of claim 32, wherein measuring the error in phase between the I and Q output signal comprises filtering out a DC component from the multiplication of the reference signal with the I and Q output signal.

34. A method for calibrating the in-phase (I) and quadrature (Q) path output signals of a receiver, comprising:
  generating a calibration signal at a first frequency from a local oscillator signal of a receiver;
  translating the calibration signal to a second frequency in the conversion section of the receiver;
  generating a reference signal at the second frequency from the same local oscillator signal, wherein the reference signal has a coherent phase relationship with the calibration signal; and
  extracting the translated calibration signal from an I and a Q output signal of the conversion section with the reference signal,
  wherein the calibration signal comprises a high sideband and a low sideband each centered around the first frequency, wherein each sideband is offset from the first frequency by the second frequency.

35. The method of claim 34, wherein the reference signal comprises an in-phase and a quadrature component reference signal, wherein the component reference signals are at the second frequency and are phase coherent with the sidebands of the calibration signal.

* * * * *